(12) United States Patent
Sun

(10) Patent No.: US 6,185,241 B1
(45) Date of Patent: Feb. 6, 2001

(54) METAL SPATIAL FILTER TO ENHANCE MODEL REFLECTIVITY IN A VERTICAL CAVITY SURFACE EMITTING LASER

(75) Inventor: Decai Sun, Sunnyvale, CA (US)

(73) Assignee: Xerox Corporation, Stamford, CT (US)

( * ) Notice: Under 35 U.S.C. 154(b), the term of this patent shall be extended for 0 days.

(21) Appl. No.: 09/183,909

(22) Filed: Oct. 29, 1998

(51) Int. Cl.[7] .................................................. H01S 5/183
(52) U.S. Cl. ................................................ 372/96; 372/46
(58) Field of Search ..................................... 372/96, 46

(56) References Cited

U.S. PATENT DOCUMENTS

| | | | |
|---|---|---|---|
| 5,493,577 | * | 2/1996 | Choquette et al. ..................... 372/96 |
| 5,887,013 | * | 3/1999 | Lee et al. .............................. 372/96 |
| 5,892,786 | * | 4/1999 | Lott ....................................... 372/50 |
| 6,075,804 | * | 6/2000 | Deppe et al. ........................... 372/96 |

OTHER PUBLICATIONS

Morgan et al., "Transverse Mode Control of Vertical–Cavity Top–Surface–Emitting Lasers", *IEEE Photonics Technology Letters*, vol. 4, No. 4, Apr. 1993, pp. 374–377.

* cited by examiner

Primary Examiner—James W. Davie
(74) Attorney, Agent, or Firm—William Propp

(57) ABSTRACT

An annular metal layer is provided between a conductive oxide layer and a dielectric mirror in a vertical cavity surface emitting laser. The annular metal layer defines the output window for the laser cavity which matches the $TEM_{00}$ fundamental mode of the light beam emitted by the active region of the VCSEL. The metal layer outside the output window provides modal reflectivity discrimination against high order transverse modes of the light beam emitted by the active region of the VCSEL.

9 Claims, 1 Drawing Sheet

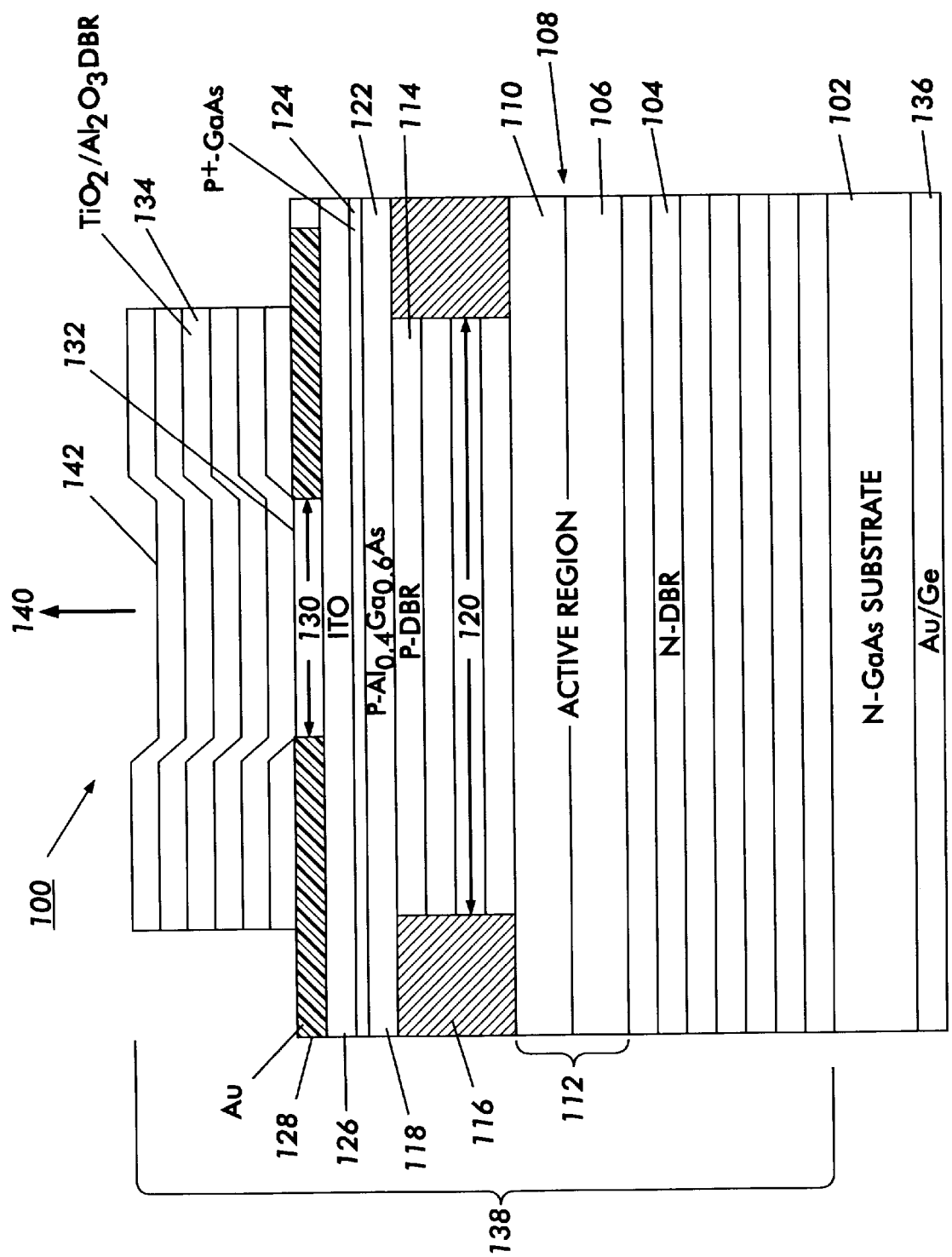

METAL SPATIAL FILTER TO ENHANCE MODEL REFLECTIVITY IN A VERTICAL CAVITY SURFACE EMITTING LASER

BACKGROUND OF THE INVENTION

This invention relates to a vertical cavity surface emitting laser ("VCSEL") and, more particularly, to a metal spatial filter layer to enhance modal reflectivity for the fundamental mode in a VCSEL.

Vertical cavity surface emitting lasers are very desirable light sources for high speed laser printing, optical fiber communications and other applications. VCSELs have several advantages over edge emitting lasers including an emitted beam with a small angular divergence, a circular, anastigmatic beam and ease of fabrication into one or two dimensional arrays.

For many of these applications, a single mode output is required from the VCSEL. However, VCSELs tend to have poor spatial mode discrimination and nonuniform current injection. One of the challenges in the current state of VCSEL technology is the achievement of higher levels of output power with single mode behavior.

One means to achieve a single mode VCSEL is to enhance the reflectivity for the fundamental mode within the laser aperture.

It is an object of the present invention to provide a vertical cavity surface emitting laser operating in a single mode.

SUMMARY OF THE INVENTION

The present invention provides an annular metal layer between a conductive oxide layer and a dielectric mirror in a vertical cavity surface emitting laser. The annular metal layer defines the output window for the laser cavity which matches the $TEM_{00}$ fundamental mode of the light beam emitted by the active region of the VCSEL. The metal layer outside the output window provides modal reflectivity discrimination against high order transverse modes of the light beam emitted by the active region of the VCSEL.

Other objects and attainments together with a filler understanding of the invention will become apparent and appreciated by referring to the following description and claims taken in conjunction with the accompanying drawings.

BRIEF DESCRIPTION OF THE DRAWINGS

FIG. 1 is a cross-sectional side view of the semiconductor layers of the vertical cavity surface emitting laser with a metal spatial filter layer to enhance modal reflectivity for the fundamental mode of the laser structure of the present invention.

DETAILED DESCRIPTION OF PREFERRED EMBODIMENTS

FIG. 1 illustrates a vertical cavity surface emitting laser ("VCSEL") structure 100 using a gold (Au) spatial filter layer inserted between a indium tin oxide ("ITO") conductive oxide layer and a dielectric quarterwave stack distributed Bragg reflector ("DBR") mirror to enhance the modal reflectivity for the fundamental mode in accordance with the present invention.

The monolithic laser structure 100 can be fabricated by a technique such as metalorganic chemical vapor deposition (MOCVD) as is well known in the art. Other deposition processes such as liquid phase epitaxy ("LPE"), molecular beam epitaxy ("MBE"), or other known crystal growth processes can also be used. In this embodiment, the VCSEL structure 100 comprises a substrate 102 of n-GaAs which is 350 $\mu$m thick and is n-doped with silicon to a doping level of approximately $5 \times 10^{18}$ cm$^{-3}$ or higher.

A lower n-distributed Bragg reflector (DBR) 104 is deposited on the n-GaAs substrate 102. The n-DBR 104 is composed of 30 pairs or more of alternating layers of $Al_{0.5}Ga_{0.5}As$ and AlAs which are n-doped with silicon to a doping level of $3 \times 10^{18}$ cm$^{-3}$. Each layer has a quarter wavelength thickness with the wavelength being the wavelength of the light emitted by the VCSEL structure 100.

A lower n-$(Al_{0.6}Ga_{0.4})_{0.5}In_{0.5}P$ confinement layer 106 is deposited on the n-DBR 104. The confinement layer 106 is 96 nm thick and undoped.

An $In_{0.6}Ga_{0.4}P$ active layer 108 is deposited on the lower confinement layer 106. The active layer 108 will emit light at approximately 670 nanometers which is in the red spectrum. The active layer 108 may be a single quantum well layer, a multiple quantum well layer or a layer with a thickness greater than that of a quantum well. The thickness of the $In_{0.6}Ga_{0.4}P$ active layer 108 is 8 nanometers.

An upper p-$(Al_{0.6}Ga_{0.4})_{0.5}In_{0.5}P$ confinement layer 110 is deposited on the active layer 108. The confinement layer 110 is 96 nm thick and undoped.

The active region 112 of the VCSEL structure 100 for emission of light comprises the two confinement layers 106 and 110 and the active layer 108.

An upper p-distributed Bragg reflector (DBR) 114 is deposited on the confinement layer 110. The p-DBR 114 is composed of 10 pairs of alternating layers of $Al_{0.5}Ga_{0.5}As$ and AlAs which are p-doped with magnesium to a doping level of $3 \times 10^{18}$ cm$^{-3}$. Each layer has a quarter wavelength thickness with the wavelength being the wavelength of the light emitted by the VCSEL structure 100.

Ion implantation regions 116 are formed in the p-DBR 114 by implantation of He+ or O+ ions through the top surface 118 of the p-DBR 114 by masking as is known in the art. These ion implantation regions serve to electrically and optically confine the vertical laser cavity of the VCSEL 100. The regions 116 are annular in shape and extend longitudinally down the height of the p-DBR 114. The 10 $\mu$m circular diameter 120 of the non-implanted p-DBR 114 will be the width of the laser cavity.

A p-$Al_{0.4}Ga_{0.6}As$ layer 122 is deposited on top of the p-DBR 114 and the ion implanted regions 116. The layer 122 is 220 nm thick and is doped with magnesium to a doping level of $5 \times 10^{18}$ cm$^{-3}$.

A p$^+$-GaAs cap layer 124 is deposited on top of the $Al_{0.4}Ga_{0.6}As$ layer 122. The cap layer 124 is 16 nm thick and doped with magnesium to a doping level of $1 \times 10^{19}$ cm$^{-3}$. The total thickness of these two contact layers 122 and 124 is one and a quarter of the emission wavelength of the active layer 108.

An indium tin oxide (ITO) conductive layer 126 is deposited on the cap layer 124. The ITO layer 126 is 88 nm thick or a quarter wavelength thickness of the emission wavelength of the active layer 108.

A metal spatial filter layer 128 of gold (Au) is deposited on the ITO conductive layer 126. The gold spatial filter layer 128 is 300 nm thick and undoped. The metal layer 128 will function as the p-contact for the VCSEL structure 100. The metal layer 128 will also function as a spatial filter for the light beam emitted by the VCSEL structure 100. The gold spatial filter/contact layer 128 is annular having a center diameter 130 of exposed ITO layer 126 which will form the output window 132 of the vertical laser cavity. The diameter 130 of the output window 132 is 5 μm.

A dielectric mirror 134 is deposited on the annular metal spatial filter/contact layer 128 and the output window 132 of the ITO layer 126 by e-beam evaporation as is known in the art. The dielectric mirror 134 is composed of 3 pairs of dielectric quarter wavelength layers of $TiO_2/Al_2O_3$ forming a distributed Bragg reflector (DBR).

A gold/germanium (Au/Ge) n-contact 136 is deposited on the n-GaAs substrate 102 on the side opposite from the n-DBR 104. The n-contact 136 is 200 nm thick.

The refractive indices of the dielectric mirror 134 of $TiO_2$ of 2.5 and $Al_2O_3$ of 1.8 and the refractive index of the conductive layer 126 of ITO of 2.0 combine with the p-type $Al_{0.5}Ga_{0.5}As$/AlAs quarter wave layers of the p-DBR 114 and the $Al_{0.4}Ga_{0.6}As$/GaAs contact layers 122 and 124 to form a very high reflectivity mirror for the output window 132 of the vertical laser cavity.

The vertical laser cavity 138 comprises of the n-DBR 104, the lower confinement layer 106, the active layer 108, the upper confinement layer 110, the non-implanted p-DBR 114, the contact layers 122 and 124, the output window region 132 of the ITO layer 126 and the dielectric DBR mirror 134.

Current will flow from the p-contact, the gold contact layer 128 laterally through the ITO conductive layer 126, the contact layers 124 and 122, through the non-implanted p-DBR 114, through the upper confinement layer 110, through the active layer 108 to forward bias the active region 112 to emit light, through the lower confinement layer 106, through the n-DBR 104 and through the n-substrate 102 to the n-contact, the gold/germanium layer 134. The current will cause the active layer 108 of the active region 112 to emit a coherent light beam 140 of 670 nanometer wavelength through the non-implanted p-DBR 114, the contact layers 122 and 124, the output window region 132 of the ITO layer 126, the dielectric mirror 134 and the surface 142 of the dielectric mirror of the vertical laser cavity 138 of the VCSEL 100.

The 5 μm diameter 130 of the output window 132 in the gold spatial filter layer 128 matches the size of the $TEM_{00}$ fundamental mode of the light beam 140 of 670 nanometer wavelength emitted by the active layer 108.

The gold contact layer 128, outside of the output window 130, functions as a spatial filter for the light emitted within the laser cavity 138. The gold layer blocks the transmission of the beam through the dielectric mirror 134 and thus blocks the transmission of the beam through the surface 142 of the VCSEL 100. Light can only be transmitted through the output window 130.

Furthermore, the gold layer 128 reflects light within the laser cavity with a phase shift of slightly less than 90 degrees. The quarter wavelength thick ITO layer 126 and the $TiO_2$ interface reflects the light with a 360 degree of phase shift.

Thus, light reflected within the laser cavity just by the ITO layer, which is light parallel to the output window, stays in phase and is eventually emitted. This light is just the single fundamental $TEM_{00}$ mode of light emitted by the active region.

Light reflected by the gold layer is not in phase with the reflected beams in the p-DBR layers 114 which causes the light to interfere destructively within the laser cavity which reduces its emission. The Au reduces the reflectivity of the higher order modes of light emitted by the active region. The higher order transverse modes experience much lower reflectivity than $TEM_{00}$ mode.

The key novelty of this approach is that conductive indium tin oxide (ITO) combined with gold (Au) window structures are used to provide modal reflectivity discrimination against high order transverse modes so that high reflectivity is offered for the fundamental TEM00 mode only.

The ITO conductive layer 126 is used for both electrical and optical purposes. It not only assists electric current to flow into the central active region, but also provides reflection and transmission for the optical beam. Other metallic oxides such as cadmium tin oxide (CTO) may substitute for ITO.

The spatial filter/contact layer 128 can be other opaque metals such as gold, silver, aluminum, titanium or alloys of those metals which as non-transparent to the wavelength of the emitted light and can conduct a current into the laser cavity.

The gold contact layer 128 is used to define an output window to provide modal reflectivity discrimination against high order transverse modes.

The dielectric layers 134 are used to maximize reflectivity for the fundamental $TEM_{00}$ mode of emitted light. They can also help to correct the Fabry-Perot mode position of the grown VCSEL structure 100.

Only shallow ion implantation is needed to define electric current confinement, which is much easier compared to high-energy deep ion-implantation needed for conventional VCSEL structures. The high resistivity, ion implanted regions 116 around the laser cavity 138 channel the current through the active region 112.

The diameter of the non-implanted p-DBR inside the implanted region can be larger than the diameter of the output window for the ease of fabrication. Also since the p-type semiconductor DBR layers are less than 1.5 μm thick, much thinner than that of a regular VCSEL (over 3 μm), which normally consists of over 30 pairs of AlGaAs/AlAs quarter wave layers, the ion implantation step for electric confinement is much easier.

The example of the VCSEL 100 of FIG. 1 is merely illustrative. By changing the composition of the semiconductor layers and dielectric layers of the DBRs and the confinement layers and especially the active region, this approach of an ITO layer and a gold contact/spatial filter layer with an output window is suitable for red and infrared VCSELs with emission wavelength from 640 to 980 nm. The fundamental mode sees a higher reflectivity than the higher order modes. For example, the DBR can have alternating layers of $Al_{0.2}Ga_{0.8}As$/AlAs with an $In_{0.15}Al_{0.15}Ga_{0.7}As$ active layer for an infrared VCSEL which emits light at approximately 835 nanometers.

While the invention has been described in conjunction with specific embodiments, it is evident to those skilled in the art that many alternatives, modifications, and variations will be apparent in light of the foregoing description. Accordingly, the invention is intended to embrace all such alternatives, modifications, and variations that fall within the spirit and scope of the appended claims.

What is claimed is:

1. A surface emitting laser for emitting coherent light comprising:

a substrate;

a plurality of semiconductor layers formed on said substrate;

one or more of said plurality of semiconductor layers forming an active region;

a conductive oxide semiconductor layer being one of said plurality of semiconductive layers, an annular metal layer formed on said conductive oxide semiconductor layer, said annular metal layer forming an output window for the fundamental mode of coherent light emitted by said active region, said annular metal layer suppressing reflectivity for the high orders of coherent light emitted by said active region;

a mirror of dielectric layers having quarterwave thickness formed on said annular metal layer and within said annular metal layer on said conductive oxide semiconductor layer; and first and second electrodes which enable biasing of said active region to emit coherent light, said first electrode being formed on said annular metal layer.

2. The surface emitting laser for emitting coherent light of claim 1 wherein said annular metal layer shifts the phase of said high orders of light emitted by said active region to suppress the reflectivity of said high orders of coherent light emitted by said active region.

3. The surface emitting laser for emitting coherent light of claim 1 wherein said annular metal layer is gold.

4. The surface emitting laser for emitting coherent light of claim 1 wherein said annular metal layer is silver, aluminum or titanium.

5. The surface emitting laser for emitting coherent light of claim 1 wherein said conductive oxide semiconductor layer is indium tin oxide.

6. The surface emitting laser for emitting coherent light of claim 1 wherein said conductive oxide semiconductor layer is cadmium tin oxide.

7. The surface emitting laser for emitting coherent light of claim 1 further comprising one or more of said plurality of semiconductor layers forming a distributed Bragg reflector, said conductive oxide semiconductor layer being formed on said distributed Bragg reflector.

8. The surface emitting laser for emitting coherent light of claim 7 further comprising ion implantation regions in said distributed Bragg reflector for optically and electrically confining a laser cavity for said coherent light emitted by said active region through said output window of said annular metal layer.

9. The surface emitting laser for emitting coherent light of claim 1 wherein said annular metal layer is gold and said conductive oxide semiconductor layer is indium tin oxide.

* * * * *

UNITED STATES PATENT AND TRADEMARK OFFICE
CERTIFICATE OF CORRECTION

PATENT NO. : 6,185,241 B1
DATED : February 6, 2001
INVENTOR(S) : Decai Sun

It is certified that error appears in the above-identified patent and that said Letters Patent is hereby corrected as shown below:

Column 1,
Line 4, insert:
-- This invention was made with Government support under Agreement No. F19628-94-C-0023 awarded by the Department of the Air Force. The Government has certain rights in this invention. --.

Signed and Sealed this

Thirtieth Day of May, 2006

JON W. DUDAS
*Director of the United States Patent and Trademark Office*